(12) United States Patent
Lee

(10) Patent No.: US 8,759,968 B2
(45) Date of Patent: Jun. 24, 2014

(54) SEMICONDUCTOR MEMORY APPARATUS FOR CONTROLLING PADS AND MULTI-CHIP PACKAGE HAVING THE SAME

(75) Inventor: Tae-Yong Lee, Ichon-shi (KR)

(73) Assignee: SK hynix Inc. (KR)

( * ) Notice: Subject to any disclaimer, the term of this patent is extended or adjusted under 35 U.S.C. 154(b) by 389 days.

(21) Appl. No.: 13/243,755

(22) Filed: Sep. 23, 2011

(65) Prior Publication Data

US 2012/0012844 A1  Jan. 19, 2012

Related U.S. Application Data

(62) Division of application No. 12/346,570, filed on Dec. 30, 2008, now Pat. No. 8,044,395.

(30) Foreign Application Priority Data

Aug. 8, 2008 (KR) .................. 10-2008-0077703

(51) Int. Cl.
*H01L 23/34* (2006.01)

(52) U.S. Cl.
USPC ........................... 257/723; 257/724; 257/725

(58) Field of Classification Search
CPC .............. H01L 2924/1011; H01L 2924/1515; H01L 2924/1532; H01L 2924/1533; H01L 2924/181; H01L 2224/48227; H01L 2224/732
USPC ......................... 257/723, 724, 725
See application file for complete search history.

(56) References Cited

U.S. PATENT DOCUMENTS

| | | | |
|---|---|---|---|
| 4,691,287 A | 9/1987 | Suzuki et al. | |
| 6,313,493 B1 | 11/2001 | Mori et al. | |
| 7,190,604 B2 | 3/2007 | Hung et al. | |
| 7,279,669 B2 | 10/2007 | Uehara | |
| 7,875,985 B2 * | 1/2011 | Hiller et al. | 257/786 |
| 8,278,147 B2 * | 10/2012 | Kado et al. | 438/110 |
| 8,524,534 B2 * | 9/2013 | Kado et al. | 438/110 |
| 2001/0009383 A1 | 7/2001 | Nakayama et al. | |
| 2003/0214344 A1 | 11/2003 | Suwa et al. | |
| 2004/0041281 A1 | 3/2004 | Sakai et al. | |
| 2004/0119139 A1 | 6/2004 | Hojo et al. | |
| 2006/0208345 A1 | 9/2006 | Nakatsu et al. | |
| 2006/0255477 A1 | 11/2006 | Kim et al. | |
| 2007/0051950 A1 | 3/2007 | Kobayashi et al. | |
| 2007/0262465 A1 | 11/2007 | Iwabuchi | |
| 2008/0150111 A1 * | 6/2008 | Hiller et al. | 257/686 |

FOREIGN PATENT DOCUMENTS

| | | |
|---|---|---|
| KR | 10-1994-002674 | 10/1994 |
| KR | 1020030035803 A | 5/2003 |
| KR | 10-0485547 | 4/2005 |
| KR | 1020080013937 A | 2/2008 |

* cited by examiner

*Primary Examiner* — Ngan Ngo
(74) *Attorney, Agent, or Firm* — Baker & McKenzie LLP

(57) ABSTRACT

A semiconductor memory apparatus includes a first pad group located along a first edge of a plurality of banks, a second pad group located along a second edge of the plurality of banks opposite the first pad group, and a pad control section configured to provide first and second bonding signals and to implement control operation in response to a test mode signal and a bonding option signal to selectively employ signals from the first and second pad groups.

16 Claims, 4 Drawing Sheets

SEMICONDUCTOR MEMORY APPARATUS FOR CONTROLLING PADS AND MULTI-CHIP PACKAGE HAVING THE SAME

CROSS-REFERENCES TO RELATED APPLICATION

The present application is a divisional application of U.S. patent application Ser. No. 12/346,570 entitled "Semiconductor Memory Apparatus for Controlling Pads and Multi-Chip Package Having the Same" filed Dec. 30, 2008 which dams priority under 35 U.S.C. §119(a) to Korean application number 10-2008-0077703 filed on Aug. 8, 2008 in the Korean Intellectual Property Office, which are incorporated herein by reference in their entirety as set forth in full.

BACKGROUND

1. Technical Field

The embodiments described herein relate to a semiconductor memory apparatus and a multi-chip package having the same, and more particularly, to a semiconductor memory apparatus which can control pads on both edges or one edge and a multi-chip package having the same.

2. Related Art

In general, as sizes of semiconductor packages gradually decrease due to the miniaturization of electronic appliances, such as portable electronics appliance, and trends toward light, thin, compact, and miniaturized designs increase, as well as demands for multi-functionality, requirements are made to decrease the thickness of the semiconductor package. Accordingly, a semiconductor package includes at least two semiconductor chips having the same functionality are stacked to increase capacity to at least two times. This stacked chip semiconductor package is commonly called a multi-chip package (MCP).

In the MCP, since a plurality of semiconductor chips can be provided in one package, an overall size of the package can be significantly reduced. However, when manufacturing the MCP, in order to prevent the bonding wires connected to the semiconductor chips from being damaged, support members, such as spacers, should be formed between the stacked semiconductor chips. Accordingly, the lengths of the bonding wires of the semiconductor chips are increased, wherein stability of the bonding wires deteriorates. In addition, the routing of signals through the bonding wires is problematic due to the increased lengthens of the bonding wires.

In addition, since address pads and command pads are located along one edge of the semiconductor chips and data input and output pads and power pads are located along another edge of the semiconductor chips, the pads on both edges must be employed for the operation of a semiconductor memory apparatus. Accordingly, during packaging processes, bonding wires must be formed on both edges to supply signals to the semiconductor memory apparatus.

SUMMARY

A semiconductor memory apparatus capable of implementing control operations to provide for changes in the length of bonding wires is described herein.

In one aspect, a semiconductor memory apparatus includes a first pad group located along a first edge of a plurality of banks, a second pad group located along a second edge of the plurality of banks opposite the first pad group, and a pad control section configured to provide first and second bonding signals and to implement control operation in response to a test mode signal and a bonding option signal to selectively employ signals from the first and second pad groups.

In another aspect, a multi-chip package includes a plurality of semiconductor memory apparatuses stacked on a substrate in stair-type configuration, each having a plurality of pads exposed along first edges thereof, a plurality of bonding wires, each electrically connecting the plurality of pads to the substrate, an encapsulant material formed on the substrate and molding the semiconductor memory apparatuses and the bonding wires, and a pad control section configured in each of the plurality of semiconductor memory apparatuses to control signal transmission between the plurality of pads and a corresponding one of the plurality of semiconductor memory apparatuses.

In another aspect, a multi-chip package includes a plurality of semiconductor memory apparatuses, each having protruding bonding regions and overlapping device regions, and sequentially stacked on a substrate such that the protruding bonding regions are exposed, a plurality of bonding wires, each electrically connecting the protruding bonding regions with the substrate, an encapsulant material formed on the substrate and molding the plurality of semiconductor memory apparatuses and the plurality of bonding wires, and a pad control section configured in each of the overlapping device regions to control signal transmission paths between the overlapping device region and the protruding bonding region.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
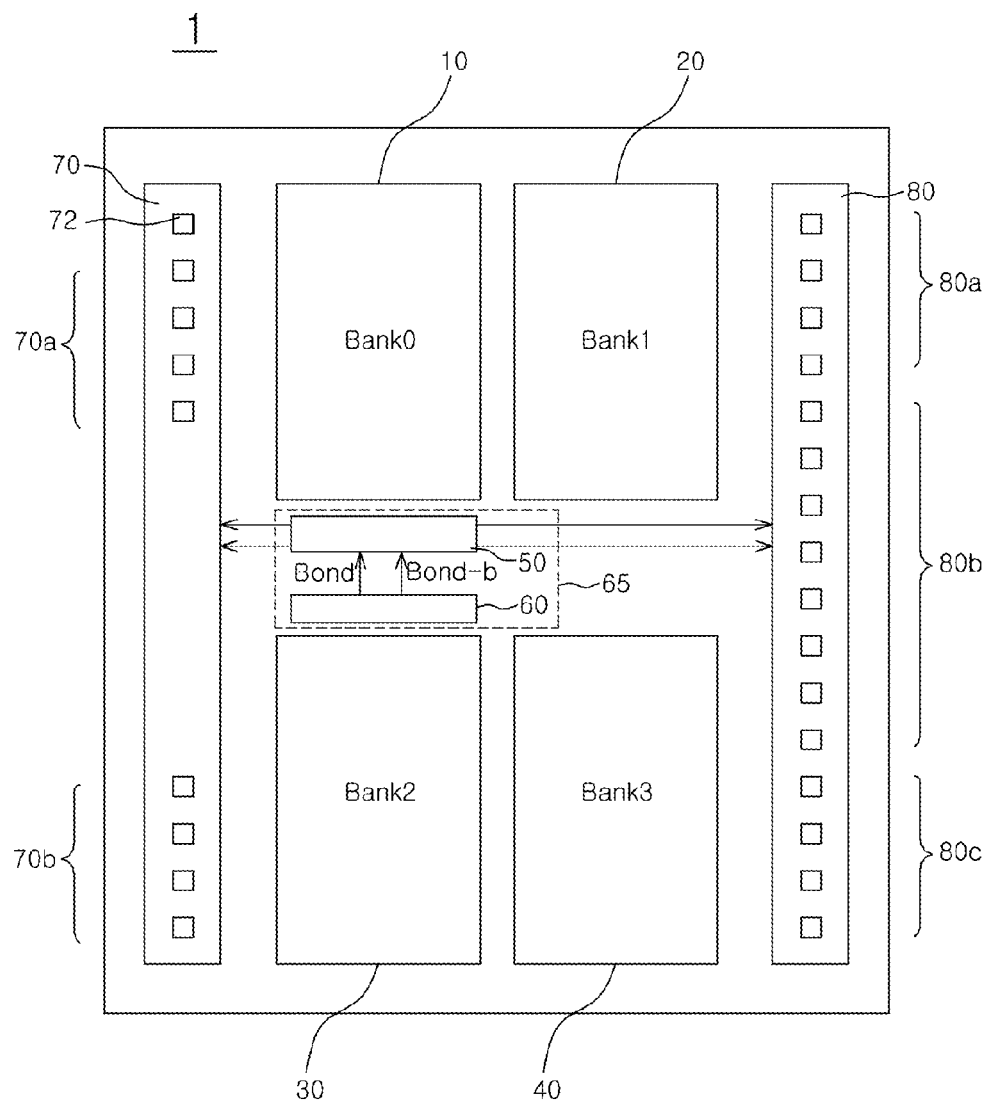
FIG. 1 is a schematic block diagram of an exemplary semiconductor memory apparatus according to one embodiment.

FIG. 1 is a schematic block diagram of an exemplary semiconductor memory apparatus according to one embodiment. In FIG. 1, a semiconductor memory apparatus 1 can be configured to include a plurality of banks 10, 20, 30, and 40, a pad control section 65, and first and second edge pad groups 70 and 80. Although the plurality of banks are exemplified as first, second, third, and fourth banks 10, 20, 30, and 40, the semiconductor memory apparatus 1 is not necessarily limited to 4 total banks, and can include more or less than 4 total banks. Accordingly, the total number of addresses can be determined by the total number of unit cells provided in each of the plurality of banks 10, 20, 30, and 40, whereby the total number of address input and output pads can be determined. Furthermore, the total number of data input and output pads can be determined by a data bandwidth.

In FIG. 1, the pad control section 65 can include a signal transmission unit 50 and a bonding signal generation unit 60. Here, the bonding signal generation unit 60 can be configured to provide first and second bonding signals 'Bond' and 'Bond_b' in response to test modes to selectively control the first and second edge pad groups 70 and 80. For example, the bonding signal generation unit 60 can implement selective control operations depending upon a test mode such that both the first and second edge pad groups 70 and 80 can be used, or only one of the first and second edge pad groups 70 and 80 can be used.

The signal transmission unit 50 can control signal transmissions to the first and second edge pad groups 70 and 80 in response to the first and second bonding signals 'Bond' and 'Bond_b'.

In addition, the first edge pad group 70 can supply signals to the plurality of banks 10, 20, 30, and 40 and can be located along one edge when viewed in a direction in which a substrate (not shown) extends. For example, the first edge pad group 70 can include an address pad group 70a and a command pad group 70b, and a bonding option pad 72. Here, the bonding option pad 72 can serve as a signal supplying part for allowing signals to be selectively supplied even to a pad group disposed on a package in which bonding wires are not formed by using the pad control section 65. For example, the bonding option pad 72 can be provided as reserve pads in anticipation of future requirements, or can be omitted based upon configurations of a semiconductor memory apparatus and a control circuit.

In FIG. 1, the second edge pad group 80 can be located along a face of the first edge pad group 70 extending along the direction in which the substrate extends. For example, the second edge pad group 80 can include a data input and output pad group 80a, a command and address pad group 80b, and a power pad group 80c. Here, the command and address pad group 80b can be a pad group that can perform substantially the same function and can have substantially the same number of pads as the command pad group 70b and the address pad group 70a of the first edge pad group 70. Accordingly, the number of pads arranged in the second edge pad group 80 can be greater than the number of pads arranged in the first edge pad group 70. For example, pads can be arranged at denser intervals in the second edge pad group 80. This allows all of the pads to be fully employed even when only the second edge pad group 80 is used depending upon a test mode.

Accordingly, a semiconductor memory apparatus having controlling pads on both edges of the substrate (not shown) may be employed, but only one pad group along one edge can be used. For example, address and command pads can be provided twice, and the pad control section 65 can be provided to control the pads. Thus, it is possible to provide a semiconductor memory apparatus capable of controlling pads in a combination-type configuration.

Figure 2:
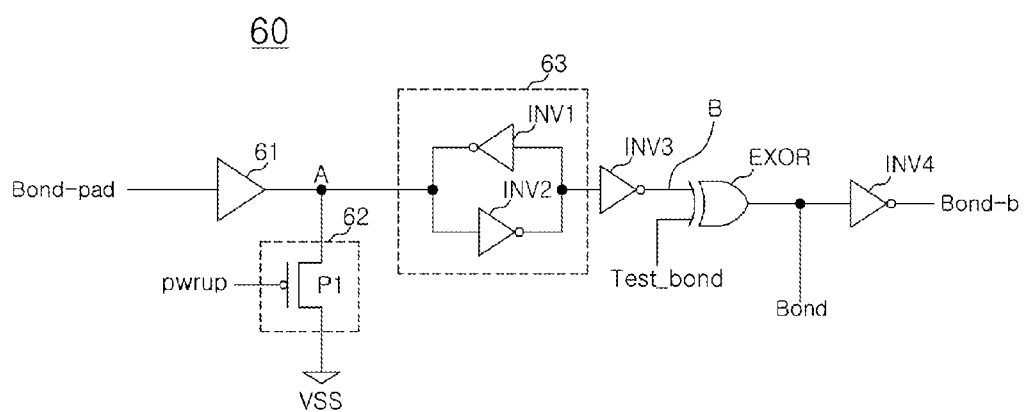
FIG. 2 is a schematic circuit diagram of an exemplary bonding signal generation unit capable of being implemented in the apparatus of FIG. 1 according to one embodiment.

FIG. 2 is a schematic circuit diagram of an exemplary bonding signal generation unit capable of being implemented in the apparatus of FIG. 1 according to one embodiment. In FIG. 2, the bonding signal generation unit 60 can be configured to include a buffer part 61, a power-up signal receiving part 62, a latch part 63, and a combining gate EXOR.

The buffer part 61 can be configured to receive and buffer a bonding option pad signal 'Bond_pad' that can be supplied from the bonding option pad 72 arranged in the first edge pad group 70. For example, the bonding option pad signal 'Bond_pad' having a high level denotes that both edge pad groups 70 and 80 can be used, whereas the bonding option pad signal \Bond_pad having a low level denotes that only one edge pad group 70 or 80 can be used.

The power-up signal receiving part 62 can be configured to transition a node (A) to have a high level in response to a power-up signal 'pwrup' that can be activated to a low level upon power-up in the initial operation of the semiconductor memory apparatus. After the power-up, the power-up signal receiving part 62 can transition the node (A) into a floating state in response to the power-up signal 'pwrup' having a low level. For example, the power-up signal receiving part 62 can include a PMOS transistor P1 having a gate terminal receiving the power-up signal 'pwrup', a drain terminal connected to the node (A), and a source terminal connected to an external power supply source VSS. Accordingly, the power-up signal receiving part 62 can be provided in reserve to initialize the node (A) to a high level when a signal is not supplied from the bonding option pad 72.

In FIG. 2, the latch part 63 can include first and second inverters INV1 and INV2 connected in a latch-type configuration. Here, the latch part 63 can invert and latch signals of the node (A).

The combining gate EXOR can exclusively-OR the output signal of a node (B) and a test mode signal 'Test_bond', and can provide the first bonding signal 'Bond'. For example, the activated test mode signal 'Test_bond' can be a flag signal indicating that only one edge pad group of both the first and second edge pad groups 70 and 80 (in FIG. 1) will be employed. Here, the test mode signal 'Test_bond' can be provided from a mode register set (MRS). In addition, a fourth inverter INV4 can be configured to invert the first bonding signal 'Bond' and provide the second bonding signal 'Bond_b'.

An exemplary operation of the bonding signal generation unit 60 when the bonding option pad signal 'Bond_pad' of a high level is supplied includes a signal that passes through the latch part 63 and a third inverter INV3 and has a high level, i.e., the signal of the node (B), and is supplied to one terminal of the combining gate EXOR. At this time, if the test mode signal 'Test_bond' has a low level, then the combining gate EXOR can provide the first bonding signal 'Bond' of a high level. Accordingly, the second bonding signal 'Bond_b' can be provided as a signal having a low level obtained by inverting the level of the first bonding signal 'Bond'.

An exemplary operation in which the bonding option pad signal 'Bond_pad' of a high level and the test mode signal 'Test_bond' of a high level are supplied includes a signal that passes through the latch part 63 and the third inverter INV3 and has a high level, the signal of the node (B), and is applied to one terminal of the combining gate EXOR. Conversely, the test mode signal 'Test_bond' having a high level can be supplied to the other terminal of the combining gate EXOR. Thus, the combining gate EXOR can provide the first bonding signal 'Bond' of a low level. Moreover, the second bonding signal 'Bond_b' can be provided as a signal having a high level obtained by inverting the level of the first bonding signal 'Bond'.

As a result, even though the bonding option pad signal 'Bond_pad' of a high level is supplied, the levels of the first and second bonding signals 'Bond' and 'Bond_b' can be changed depending upon the level of the test mode signal 'Test_bond'.

An exemplary operation in which both of the bonding option pad signal 'Bond_pad' and the test mode signal 'Test_bond' have low levels includes a signal that passes through the latch part 63 and the third inverter INV3 and has a low level, i.e., the signal of the node (B), and is supplied to one terminal of the combining gate EXOR. Since the test mode signal 'Test_bond' has a low level, the combining gate EXOR can provide the first bonding signal 'Bond' of a low level. Accordingly, the second bonding signal 'Bond_b' can be provided as a signal having a high level obtained by inverting the level of the first bonding signal 'Bond'.

An exemplary operation in which the bonding option pad signal 'Bond_pad' of a low level and the test mode signal 'Test_bond' of a high level are supplied includes a signal that passes through the latch part 63 and the third inverter INV3 and has a low level, i.e., the signal of the node (B), and is supplied to one terminal of the combining gate EXOR. Conversely, the test mode signal 'Test_bond' having a high level can be supplied to the other terminal of the combining gate EXOR. Thus, the combining gate EXOR can provide the first bonding signal 'Bond' of a high level. Furthermore, the second bonding signal 'Bond_b' can be provided as a signal having a low level obtained by inverting the level of the first bonding signal 'Bond'.

Thus, even though both edge pad groups 70 and 80 (in FIG. 1) can be employed, the levels of the first and second bonding signals 'Bond' and 'Bond_b' can be changed depending upon the test mode signal 'Test_bond'. In addition, the bonding option pad 72 can be omitted, whereby selective control can be made such that both the first and second edge pad groups 70 and 80 (in FIG. 1) or one of the first and second edge pad groups 70 and 80 (in FIG. 1) can be employed in response to the test mode signal 'Test_bond'.

Figure 3:
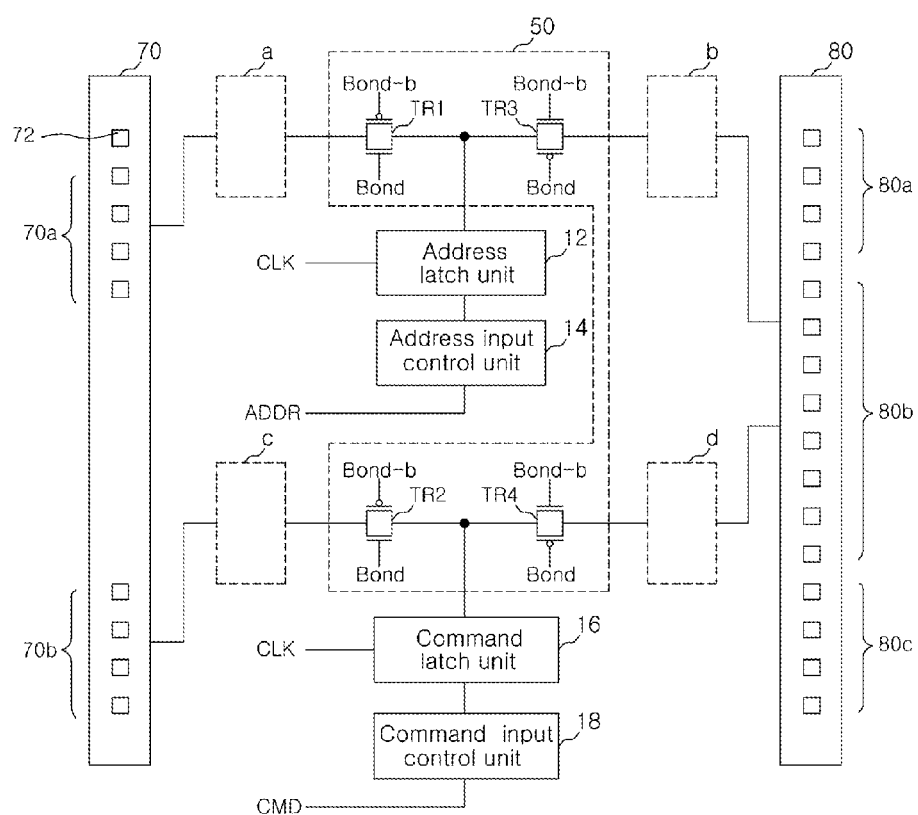
FIG. 3 is a schematic block diagram of an exemplary signal transmission unit and exemplary peripheral circuit units capable of being implemented in the apparatus of FIG. 1 according to one embodiment.

FIG. 3 is a schematic block diagram of an exemplary signal transmission unit and exemplary peripheral circuit units capable of being implemented in the apparatus of FIG. 1 according to one embodiment. In FIG. 3, relationships between the signal transmission unit 50 and the first and second edge pad groups 70 and 80 (in FIG. 1) is shown.

In FIG. 3, the signal transmission unit 50 can include first, second, third, and fourth transmission gates TR1, TR2, TR3, and TR4. In order to facilitate the understanding of the signal transmission unit 50, an address latch unit 12, an address input control unit 14, a command latch unit 16, and a command input control unit 18 are shown as peripheral circuit units.

The address latch unit 12 can be configured to latch the address signals received from the address pad group 70a of the first edge pad group 70 or the command and address pad group 80b of the second edge pad group 80, in response to a clock signal 'CLK'. The address input control unit 14 can be configured to transmit the latched address signals 'ADDR,' to the plurality of banks 10, 20, 30, and 40 (in FIG. 1).

Similarly, the command latch unit 16 can be configured to latch the command signals received from the command pad group 70b of the first edge pad group 70 or the command and address pad group 80b of the second edge pad group 80, in response to a dock signal 'CLK'. The command input control unit 18 can be configured to transmit the latched command signals 'CMD' to the plurality of banks 10, 20, 30, and 40 (in FIG. 1).

The first and second transmission gates TR1 and TR2 can be turned ON in response to the first bonding signal 'Bond' of a high level and the second bonding signal 'Bond_b' of a low level. In addition, the first and second transmission gates TR1 and TR2 can transmit signals between the address pad group 70a and the command pad group 70b of the first edge pad group 70 and the plurality of banks 10 through 40.

The third and fourth transmission gates TR3 and TR4 can be turned ON in response to the first bonding signal 'Bond' of a low level and the second bonding signal 'Bond_b' of a high level. In addition, the third and fourth transmission gates TR3 and TR4 can transmit signals between the address and command pad group 80b of the second edge pad group 80 and the plurality of banks 10 through 40.

Meanwhile, the circuit units a, b, c, and d can be interposed between the first, second, third, and fourth transmission gates TR1, TR2, TR3, and TR4, respectively. In addition, the corresponding pad groups 70a, 70b and 80b can include, for example, electro-static discharge (ESD) circuit units or charged device model (CDM) circuit units. Thus, the circuit units 1, b, c, and d can function to reduce influences caused by static electricity that can be generated when signals are supplied from the pads and can prevent electrical discharge supplied to internal circuit units.

An exemplary operation of a semiconductor memory apparatus will be described with reference to FIGS. 2 and 3.

When the address and command signals from the first edge pad group 70 are transmitted, the first bonding signal 'Bond' of a high level and the second bonding signal 'Bond_b' of a low level can be generated. Accordingly, the bonding option pad signal 'Bond_pad' of a high level and the test mode signal 'Test_bond' of a low level can be supplied, or the bonding option pad signal 'Bond_pad' of a low level and the test mode signal 'Test_bond' of a high level can be supplied.

Conversely, when the address and command signals from the second edge pad group 80 are transmitted, the first bonding signal 'Bond' of a low level and the second bonding signal 'Bond_b' of a high level can be generated. Accordingly, the bonding option pad signal 'Bond_pad' of a low level and the test mode signal 'Test_bond' of a low level can be supplied, or the bonding option pad signal 'Bond_pad' of a high level and the test mode signal 'Test_bond' of a high level can be supplied.

These exemplary operational situations are summarized as shown below in Table 1.

TABLE 1

| Signal | Bond_pad | Test_bond | Bond | Bond_b |
|--------|----------|-----------|------|--------|
| 1 | L | L | L | H |
| 2 | L | H | H | L |
| 3 | H | L | H | L |
| 4 | H | H | L | H |

As can be seen from Signals '2' and '3' in Table 1, the signals from the address and command pads of the first and second edge pad groups 70 and 80 can be selectively employed in response to the bonding option pad signal 'Bond_pad' and the test mode signal 'Test_bond'. For example, even though the bonding option pad signal 'Bond_pad' is inactivated, if the test mode signal 'Test_bond' is activated, only the second edge pad group 80 can be employed. In addition, even though the test mode signal 'Test_bond' is inactivated, if the bonding option pad signal 'Bond_pad' is activated, only the second edge pad group 80 can be employed.

By employing only the second edge pad group 80 in response to the bonding option pad signal 'Bond_pad' and the test mode signal 'Test_bond', wire bonding can be subsequently implemented along only one edge of a package. Accordingly, by implementing wire bonding along only one edge pad group, if a failure occurs in a pad of the corresponding group, it is possible to use the signals from the address and command pads of the first edge pad group 70 by utilizing the bonding option pad signal 'Bond_pad' and the test mode signal 'Test_bond'. As a consequence, it is possible to provide a semiconductor memory apparatus that can efficiently employ the pads of both edge pad groups 70 and 80 without implementing additional or dedicated wire bonding.

Figure 4:
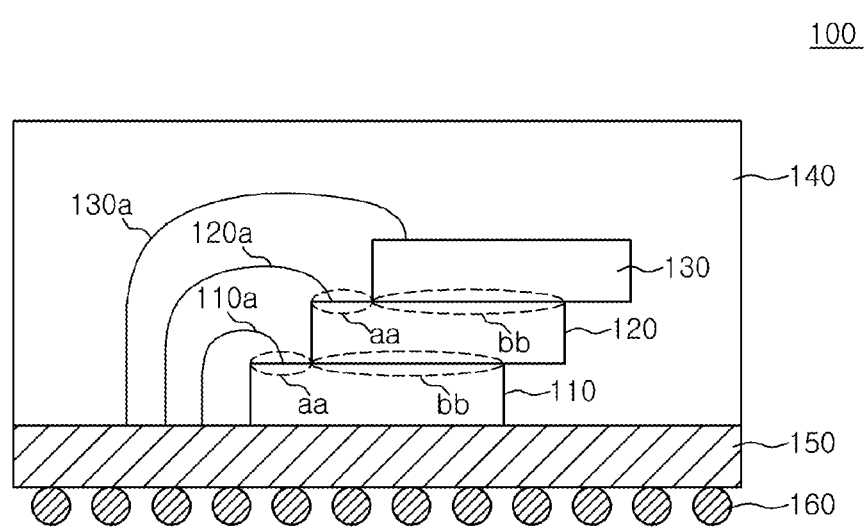
FIG. 4 is a cross-section diagram of an exemplary multi-chip package according to one embodiment.

FIG. 4 is a cross-section diagram of an exemplary multi-chip package according to one embodiment. In FIG. 4, a multi-chip package (MCP) 100 can include semiconductor memory apparatuses 1 (in FIG. 1), and can include first, second, and third semiconductor chips 110, 120, and 130 sequentially stacked on a substrate 150. For example, the semiconductor chips 110, 120, and 130 can include the semiconductor memory apparatuses 1.

In FIG. 4, the first, second, and third semiconductor chips 110, 120, and 130 can be stacked in a stair-type configuration having protruding bonding regions "aa" and overlapping device regions "bb". For example, by stacking the first, second, and third semiconductor chips 110, 120, and 130, the protruding bonding regions "aa" are exposed, and the overlapping device regions "bb" overlap with corresponding overlying chips. In addition, a plurality of bonding wires 110a, 120a, and 130a are formed within the protruding bonding regions "aa" of the first, second, and third semiconductor chips 110, 120, and 130. Since the plurality of bonding wires 110a, 120a, and 130a can be arranged along one edge of each of the first, second, and third semiconductor chips 110, 120, and 130, respectively, the use of spacers in order to ensure the stability of bonding wires is unnecessary. Thus, the thickness of the MCP 100 can be decreased. Moreover, since the lengths of the plurality of bonding wires 110a, 120a, and 130a can be shortened, the degree to which signals are distorted can be reduced. Furthermore, due to the shortening of the lengths of the plurality of bonding wires 110a, 120a, and 130a, the routing of signals can be simplified.

In FIG. 4, an encapsulant material 140 can be formed on the stacked first, second, and third semiconductor chips 110, 120, and 130. For example, the encapsulant material 140 can include an epoxy molding compound. In addition, solder balls 160 can be formed on the lower surface of the substrate 150 in order to provide external connection terminals of the MCP 100.

Since a pad control section can control both edge pad groups, even when bonding wires are formed along only one edge pad group, both edge pad groups can be selectively employed. In addition, since bonding wires are formed along only one edge pad group, spacers are not necessary. Accordingly, the thickness of an MCP can be reduced and the lengths of bonding wires can be reduced, whereby the degree of signal distortion can be reduced.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A multi-chip package, comprising:
    a plurality of semiconductor memory apparatuses stacked on a substrate in stair-type configuration, each having a plurality of pads exposed along first edges thereof;
    a plurality of bonding wires, each electrically connecting the plurality of pads to the substrate;
    an encapsulant material formed on the substrate and molding the semiconductor memory apparatuses and the bonding wires; and
    a pad control section configured in each of the plurality of semiconductor memory apparatuses to control signal transmission between the plurality of pads and a corresponding one of the plurality of semiconductor memory apparatuses,
    wherein each of the plurality of semiconductor memory apparatuses includes first and second pad groups provided along opposing edges when viewed along a direction in which the substrate extends, the first and second pad groups receive signals from the plurality of pads, and the second pad group performs substantially same function as the first pad group, and
    wherein the pad control section is configured to provide first and second bonding signals for controlling signals from the first and second pad groups to be selectively employed in response to a test mode signal and a bonding option signal.

2. The multi-chip package according to claim 1, wherein the plurality of semiconductor memory apparatuses are stacked in a manner such that an upwardly positioned semiconductor memory apparatus and a downwardly positioned semiconductor memory apparatus are brought into direct contact to overlap with each other.

3. The multi-chip package according to claim 1, wherein the pad control section comprises:
    a bonding signal generation unit configured to provide the first and second bonding signals in response to the test mode signal and the bonding option signal; and
    a signal transmission unit configured to be controlled by the first and second bonding signals and to transmit and receive signals to and from the first and second pad groups.

4. The multi-chip package according to claim 3, wherein the bonding signal generation unit includes an EXOR gate configured to receive the test mode signal and the bonding option signal.

5. The multi-chip package according to claim 3, wherein the bonding signal generation unit further comprises a power-up signal receiving part configured to receive a power-up signal.

6. The multi-chip package according to claim 3, wherein the signal transmission unit comprises:
    a first transmission gate configured to transmit and receive signals to and from the first pad group in response to the first and second bonding signals; and
    a second transmission gate configured to transmit and receive signals to and from the second pad group in response to the first and second bonding signals.

7. The multi-chip package according to claim 6, further comprising:
    a first circuit unit disposed between the first transmission gate and the first pad group; and
    a second circuit unit disposed between the second transmission gate and the second pad group,
    wherein the first and second circuit units each reduce one of static electricity and electrical discharge between the first and second pad groups and internal circuits of the plurality of semiconductor memory apparatuses.

8. A multi-chip package, comprising:
    a plurality of semiconductor memory apparatuses, each having protruding bonding regions and overlapping device regions, and sequentially stacked on a substrate such that the protruding bonding regions are exposed;
    a plurality of bonding wires, each electrically connecting the protruding bonding regions with the substrate;
    an encapsulant material formed on the substrate and molding the plurality of semiconductor memory apparatuses and the plurality of bonding wires; and
    a pad control section configured in each of the overlapping device regions to control signal transmission paths between the overlapping device region and the protruding bonding region,
    wherein each of the plurality of semiconductor memory apparatuses includes first and second pad groups provided along opposing edges when viewed along a direction in which the substrate extends, the first and second pad groups receive signals from the plurality of pads, and the second pad group performs substantially same function as the first pad group, and wherein the pad control section is configured to provide first and second bonding signals for controlling signals from the first and second pad groups to be selectively employed in response to a test mode signal and a bonding option signal.

9. The multi-chip package according to claim 8, wherein the protruding bonding regions are arranged in a stair-type configuration.

10. The multi-chip package according to claim 8, wherein the overlapping device regions are formed in areas over which the stacked semiconductor memory apparatuses overlap with one another.

11. The multi-chip package according to claim 8, wherein the plurality of semiconductor memory apparatuses are stacked in a manner such that an upwardly positioned semiconductor memory apparatus and a downwardly positioned semiconductor memory apparatus are brought into direct contact to overlap with each other.

12. The multi-chip package according to claim 8, wherein the pad control section comprises:

a bonding signal generation unit configured to provide the first and second bonding signals in response to the test mode signal and the bonding option signal; and a signal transmission unit configured to be controlled by the first and second bonding signals and to transmit and receive signals to and from the first and second pad groups.

13. The multi-chip package according to claim 12, wherein the bonding signal generation unit includes an EXOR gate configured to receive the test mode signal and the bonding option signal.

14. The multi-chip package according to claim 12, wherein the bonding signal generation unit further comprises a power-up signal receiving part configured to receive a power-up signal.

15. The multi-chip package according to claim 12, wherein the signal transmission unit comprises:

a first transmission gate configured to transmit and receive signals to and from the first pad group in response to the first and second bonding signals; and a second transmission gate configured to transmit and receive signals to and from the second pad group in response to the first and second bonding signals.

16. The multi-chip package according to claim 15, further comprising:

a first circuit unit disposed between the first transmission gate and the first pad group; and a second circuit unit disposed between the second transmission gate and the second pad group, wherein the first and second circuit units each reduce one of static electricity and electrical discharge between the first and second pad groups and internal circuits of the plurality of semiconductor memory apparatuses.

* * * * *